United States Patent [19]

Khoury et al.

[11] Patent Number: 5,327,302
[45] Date of Patent: Jul. 5, 1994

[54] DATA FILTER TUNING FOR CONSTANT DENSITY RECORDING APPLICATIONS

[75] Inventors: John M. Khoury, New Providence, N.J.; Dale H. Nelson, Shillington, Pa.

[73] Assignee: AT&T Bell Laboratories, Murray Hill, N.J.

[21] Appl. No.: 943,337

[22] Filed: Sep. 16, 1992

[51] Int. Cl.$^5$ ........................... G11B 5/035; G11B 5/09
[52] U.S. Cl. ............................................ 360/65; 360/51
[58] Field of Search .................... 360/65, 27, 29, 30, 360/46, 51, 39, 9.1, 33.1; 358/330, 335

[56] References Cited

U.S. PATENT DOCUMENTS

| | | | |
|---|---|---|---|
| 4,509,019 | 4/1985 | Banu et al. | 330/107 |
| 4,580,178 | 4/1986 | Wuori et al. | 360/39 |
| 4,656,533 | 4/1987 | Sakai et al. | 360/65 |
| 4,722,010 | 1/1988 | Suzuki et al. | 360/65 |
| 4,799,112 | 1/1989 | Bremmer et al. | 360/31 |
| 4,894,734 | 1/1990 | Fischler et al. | 360/51 |
| 4,945,311 | 7/1990 | Smith | 328/167 |
| 5,157,559 | 10/1992 | Gleason et al. | 360/65 |
| 5,159,504 | 10/1992 | Wakui | 360/65 |

OTHER PUBLICATIONS

"Design of a 15-MHz CMOS Continuous-Time Filter with On-Chip Tuning", *IEEE Journal of Solid-State Circuits*, vol. 26, No. 12, Dec. 1991, John M. Khoury, pp. 1988 through 1997.

"Magnetic Recording Handbook Technology and Applications", C. Denis Mee, Eric D. Daniel, McGraw-Hill Publishing Company 1990 pp. 690 through 740.

"Disk Interface Design Buide and Users Manual", *National Semiconductor Application Note 413*, AN-413, J. Cecil, R. Gopalan, W. Llewellyn, pp. 9-3 through 9-46.

*Primary Examiner*—Donald Hajec
*Assistant Examiner*—Patrick Wamsley
*Attorney, Agent, or Firm*—Scott W. McLellan

[57] ABSTRACT

An arrangement for tuning a data filter in a mass storage system. The filter cutoff frequency (low pass) may be set as a percentage above or below the incoming data rate to achieve the desired "eye opening" in read data. The frequency of a reference oscillator in a phase-locked-loop (PLL) and the cutoff frequency of the filter is controlled by a common control signal from the PLL. The PLL, locked to a scaled multiple of the data rate, determines the cutoff frequency of the filter.

11 Claims, 2 Drawing Sheets

DATA FILTER TUNING FOR CONSTANT DENSITY RECORDING APPLICATIONS

Background of the Invention

1. Field of the Invention

This invention relates to mass storage systems in general and, more particularly, to read channel data filters in mass storage systems.

2. Description of the Prior Art

The read channel in a mass storage system "demodulates" data read from a magnetic medium, such as a disk, and converts the demodulated data into a form which can be utilized by a computer, for example.

As will be explained in more detail below, the data recorded on the disk is preferably uniform in density, typically measured in bits per inch, to strive for the maximum data capacity that the disk can hold. A consequence of this is that the data read from (and, correspondingly, written to) the disk varies in frequency from the innermost tracks to the outermost tracks since the disk spins at a substantially constant rate.

To increase the reliability of the system, the error rate of the read data should be minimized. Since a mass storage system is similar to a conventional communication system, a filter is added to the read channel before demodulation to provide equalization and remove much of the noise in the read data. In a typical read channel, this filter is a low-pass filter whose characteristic frequency (cut-off frequency) is fixed to the frequency of the read data. However, this may not be the most optimal setting for the characteristic frequency of the filter, resulting in less than the maximum possible eye opening in the read data.

Thus, it is desirable to provide a read channel circuit having a filter that may be adjusted to provide the desired eye opening in the read data.

SUMMARY OF THE INVENTION

This and other aspects of the invention may be accomplished generally in a mass storage system having: a tunable filter for filtering data read from the system, the filter having a characteristic frequency substantially determined by a control signal; and a generator for producing a reference signal having a frequency substantially proportional to the frequency of the data. The tunable filter is characterized by a means, responsive to the reference signal, for producing the control signal such that the characteristic frequency of the filter is substantially proportional to a predetermined factor of the data frequency.

BRIEF DESCRIPTION OF THE DRAWING

The foregoing features of this invention, as well as the invention itself, may be more fully understood from the following detailed description of the drawings, in which.

DETAILED DESCRIPTION

Figure 2:
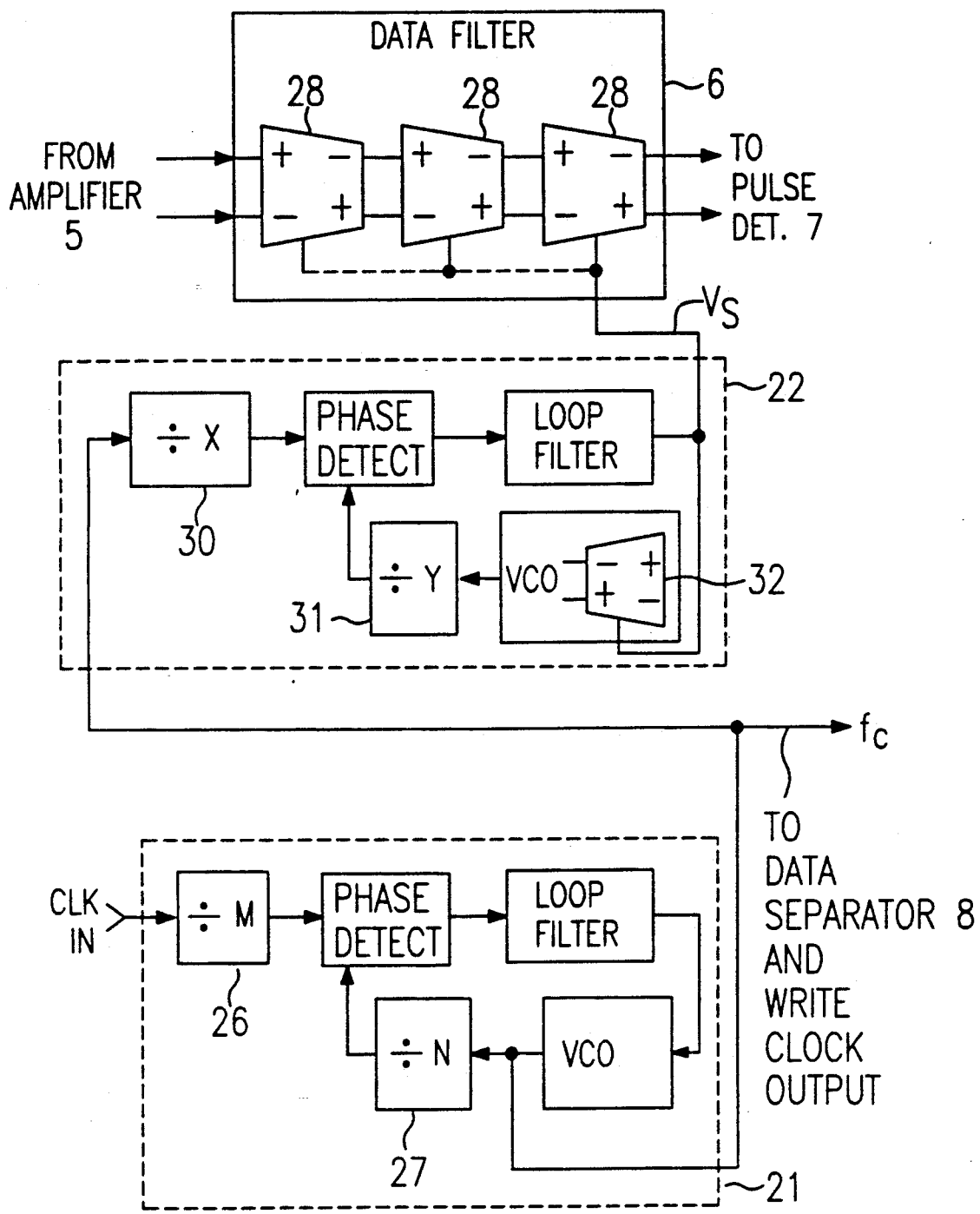
FIG. 2 is a simplified block diagram of the tunable filter according to one aspect of the invention.

In FIG. 2, an exemplary embodiment of the invention is shown. Generally, a mass storage system has: a tunable filter 6 for filtering data read from the system, the filter having a characteristic frequency substantially determined by a control signal $V_S$; and a synthesizer 21 (generator) for producing a reference signal $f_C$ having a frequency substantially proportional to the frequency of the data. The invention is characterized by means 22, responsive to the reference signal, for producing the control signal $V_S$. The characteristic frequency of the filter is determined by the means to be substantially proportional to a predetermined factor of the data frequency.

Figure 1:
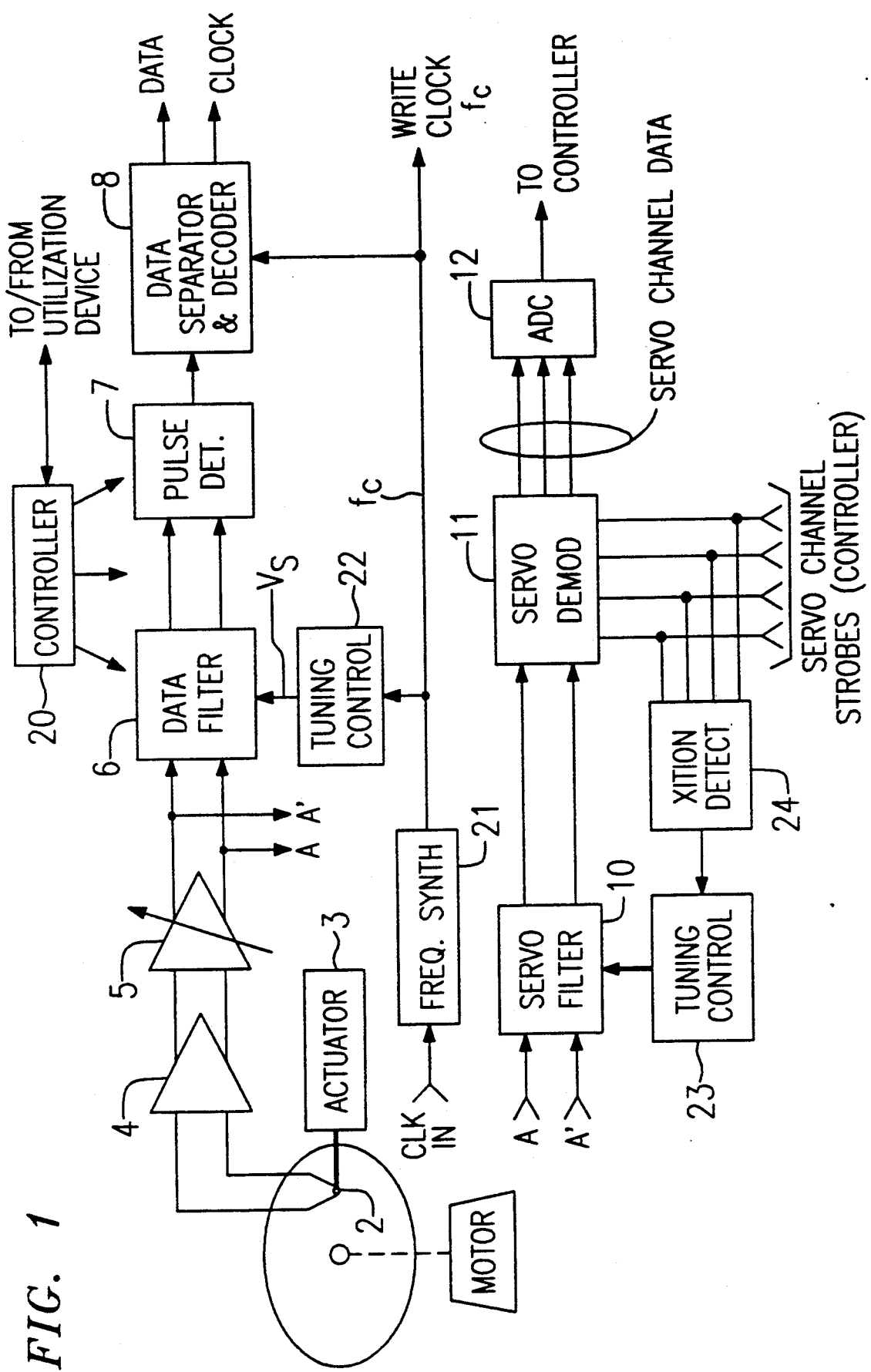
FIG. 1 is a simplified block diagram of a read channel in a mass storage system utilizing the invention.

The invention may be understood more generally by referring to FIG. 1, a generalized block diagram of the read channel in a mass storage (magnetic) system. More detailed discussion of the operation of a typical generalized mass storage system may be found in Application Note AN-413 by National Semiconductor (1989). For purposes here, the discussion of the mass storage system will be limited to an overview of the read channel portion thereof.

The mass storage system typically has a motor (not numbered) driving a magnetic medium 1, such as a magnetizable disk. Data stored on the disk 1 is read by a head 2 positioned by an actuator 3. Signals from the head 2 are first amplified by a preamplifier 4 and further amplified by a variable gain amplifier 5. The amplified signals then follow two paths, one for the data and one for servo control to keep the head centered on the desired track on the disk 1.

The amplified signals in the data path are first filtered by a data filter 6 and then the pulses therein are detected by pulse detector 7. Up to the detector 7, the signals are differential to increase the robustness to noise of the amplified low level signals from the head 2. The pulse detector 7 converts the differential signals to single-ended signals for input to a data separator and decoder 8. The separator and decoder 8 converts the detected pulses from detector 7 into data and a clock signal for utilization by a computer, etc.

The amplified signals in the servo (head control) path are first filtered by filter 10 to enhance a "servo pattern" recorded with the desired data. A servo demodulator 11 detects and demodulates the servo pattern channel data into analog form for each of the servo channels. The servo channel data is converted into digital form by analog-to-digital converter (ADC) 12 for further processing by controller 20.

Controller 20 is typically a dedicated microprocessor or digital signal processor (DSP), responsive to the utilization device (computer, etc.), which controls the detailed operation of the mass storage system. One function of the controller is to move the head 2 using the actuator 3 to the track on the disk 1 requested by the utilization device and "fine-tuning" the head position by using the servo channel data as feedback. Another function of the controller 20 is the adjustment of various circuit functions depending on the track being read/written on the disk 1, as will be discussed below.

Many mass storage systems utilize what is known as "constant density recording" to increase the data storage capacity of the disk 1. This generally involves making the density of flux reversals on the disk 1 substantially constant between outer tracks and inner tracks on the disk 1. Typically, constant density recording is accomplished by changing the frequency at which data is written depending on which track on disk 1 is being used. The change in frequency generally involves the controller 20 programming a frequency synthesizer 21 to the desired write frequency $f_C$. Because the read operation is complementary to the write operation, the frequency of the read data also changes with track location. Thus, the controller 20 programs the synthesizer 21 to the expected read data frequency before reading of the disk 1 occurs. The presetting of the synthesizer 21 allows the data separator and decoder 8 to quickly lock onto the detected data.

Tuning control 22 adjusts the characteristics of data filter 6 to track the output frequency $f_C$ provided by synthesizer 21. An exemplary filter and tuning control system is shown in U.S. Pat. No. 4,509,019, assigned to the same assignee as this application and incorporated herein by reference. As shown in the U.S. Patent, the filter and control circuitry are integrated into a common substrate. The oscillation frequency of an oscillator, which is part of a phase-locked-loop (PLL) in the control circuitry, is proportional to the filter's characteristic frequency. Thus, the characteristic frequency of the filter tracks the frequency of a signal (a reference signal) that the PLL in the tuning control locks onto. As the frequency of the reference signal varies, so varies the characteristic frequency of the filter.

Turning to FIG. 2, more detail concerning the frequency synthesizer 21, data filter 6, and tuning control 22 are shown.

Frequency synthesizer 21 is a PLL having as an input a fixed clock frequency, CLK IN. By virtue of programmable dividers 26, 27, the output frequency of the synthesizer 21 ($f_C$) is N/M times the CLK IN frequency. Programmable dividers 26, 27 are programmed by controller 20 (FIG. 1) to provide the variable frequency needed for the write clock, as discussed above.

Filter 6 is, in this exemplary embodiment, a seventh order Bessel low pass filter with a cutoff (characteristic) frequency determined by a control signal, $V_S$, derived from a VCO tuning voltage in the filter control 22. Preferably, the filter 6 is implemented with operational transconductance amplifiers (OTA) 28, the control signal $V_S$ controlling the transconductance of the OTAs 28. A similar filter is shown in "Design of a 15-MHz CMOS Continuous-Time Filter with On-Chip Tuning" by J. M. Khoury, IEEE Journal of Solid-State Circuits, Vol. 26, No. 12, December 1991, pp. 1988–97, included herein by reference.

The tuning control 22 sets the cutoff frequency of filter 6 to be substantially equal to a predetermined scaled amount of the write clock frequency $f_C$. The tuning control 22 is a frequency synthesizer similar to the synthesizer 21. Also like the synthesizer 21, there are programmable dividers 30, 31 which are also programmed by controller 20. As shown, the output frequency of voltage controlled oscillator (VCO) 32 will be Y/X times the frequency of the read or write clock $f_C$ from the synthesizer 21.

VCO 32 is a voltage controlled oscillator using two OTAs as the active element thereof, similar to that shown in the above reference. The control voltage to VCO 32 also controls the OTAs 28 in the filter 6. As discussed in the above reference, by virtue of the VCO 32 and filter 6 using substantially identical components to determine the respective frequencies thereof and a common control signal, the voltage to frequency characteristic of the VCO 32 is proportional to the characteristic (cutoff) frequency of the filter 6 and vice-versa. Preferably, the cutoff frequency of the filter 6 will be substantially equal to the output frequency of VCO 32. This results in the cutoff frequency of filter 6 being substantially determined by the controller 20 (FIG. 1) setting both the write clock frequency (by programming the synthesizer 21) and the programmable dividers 30, 31 in the tuning control 22. Thus, the cutoff frequency of the filter 6 is substantially Y/X $f_C$ (or NY/MX times the CLK IN frequency.)

During the operation of the read channel as shown in FIG. 1, the X and Y values loaded into the dividers 30, 31 (FIG. 2) are determined to be a fixed percentage of the data frequency, which is substantially equal to the write clock frequency $f_C$. Thus, the cutoff frequency of the filter 6 is scaled by Y/X of the data rate, $f_C$. This scaled amount may be determined by finding the widest "eye opening" in data read from the medium 1 when measured at the input to the pulse detector 7 (FIG. 1).

In this exemplary embodiment, the tuning control 22 is shown using the write clock from the synthesizer 21 as the reference for setting the frequency of the filter 6. It is understood that the tuning control 22 may use as a reference input the fixed frequency input CLK IN instead of the write clock. In this instance, the cutoff frequency of the filter 6 may be adjusted by programming the dividers 30, 31 depending on the track being read from the disk 1 (FIG. 1). The values for X and Y are then scaled from the values M and N (in synthesizer 21) to achieve the desired scaled frequency difference between the cutoff frequency of filter 6 and the data frequency $f_C$.

It is understood that other circuit designs for the filter 6 may be used, such as high-pass, band-pass, etc. depending on the application. Filter characteristics that may be controlled by the invention include center frequency, Q, gain, etc. In addition, the implementation of the filter 6 may be accomplished in other technologies, such as MOSFET-C.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. In a mass storage system having:
   a tunable filter for filtering data read from the system, the filter having a characteristic frequency substantially determined by a control signal; and
   a generator for producing a reference signal having a frequency substantially proportional to the frequency of the data;
   Characterized by:
   a comparison network, responsive to the reference signal, for providing a control signal; and
   a reference network, responsive to the control Signal, for providing an output signal coupled to the comparison network;
   wherein the comparison network phase locks the output signal from the reference network to the frequency of the reference signal scaled by a predetermined scale factor Y/X and the characteristic frequency of the tunable filter is substantially proportional to the scaled frequency of the reference signal.

2. The mass storage system as recited in claim 1, wherein the reference network is an oscillator, the frequency of which is substantially determined by the control signal and is proportional to the characteristic frequency of the tunable filter.

3. The mass storage system as recited in claim 2, the comparison network being further characterized by:

a first divider for dividing the frequency of the reference signal by a predetermined factor X;

a second divider for dividing the frequency of the output signal from the reference network by a predetermined factor Y;

a phase comparator, having an output, for comparing the phases of the divided reference signal and the divided output signal from the reference network; and a filter, coupling to the output of the phase comparator, for providing the control signal to the tunable filter and the reference network.

4. The mass storage system as recited in claim 3, wherein the filter and the oscillator are disposed in a common integrated circuit.

5. The mass storage system as recited in claim 3, wherein the first and second dividers are programmable.

6. The mass storage system as recited in claim 5, further characterized by a programmable frequency synthesizer for providing the reference signal.

7. The mass storage system as recited in claim 5, wherein the tunable filter is a low pass filter, the characteristic frequency of which is the cutoff frequency of the filter.

8. In a magnetic medium mass storage system read channel having:

a tunable filter for filtering data read from the medium, the filter having a characteristic frequency substantially determined by a control signal; and a generator for producing a reference signal having a frequency substantially proportional to the frequency of the read data;

Characterized by:

an oscillator, for providing an output signal, the frequency of which is substantially determined by the control signal and is proportional to the characteristic frequency of the tunable filter;

a first divider for dividing the frequency of the reference signal by a predetermined factor X;

a second divider for dividing the frequency of the output signal from the reference network by a predetermined factor Y;

a phase comparator, having an output, for comparing the phases of the divided reference signal and the divided output signal from the reference network; and a filter, coupling to the output of the phase comparator, for providing the control signal to the tunable filter and the oscillator;

wherein the characteristic frequency of the tunable filter substantially proportional to the frequency of the reference signal scaled by the factor Y/X.

9. The mass storage system as recited in claim 8, wherein the first and second dividers are programmable.

10. The mass storage system as recited in claim 9, further characterized by a programmable frequency synthesizer for providing the reference signal.

11. The mass storage system as recited in claim 10, wherein the tunable filter is a low pass filter, the characteristic frequency of which is the cutoff frequency of the filter.

* * * * *